(12) United States Patent
Yacout et al.

(10) Patent No.: US 10,392,697 B2
(45) Date of Patent: Aug. 27, 2019

(54) COMPOSITE MATRIX USING A HYBRID DEPOSITION TECHNIQUE

(71) Applicant: UCHICAGO ARGONNE, LLC, Chicago, IL (US)

(72) Inventors: Abdellatif M. Yacout, Naperville, IL (US); Sumit Bhattacharya, Evanston, IL (US); Michael J. Pellin, Naperville, IL (US)

(73) Assignee: UCHICAGO ARGONNE, LLC, Chicago, IL (US)

( * ) Notice: Subject to any disclaimer, the term of this patent is extended or adjusted under 35 U.S.C. 154(b) by 72 days.

(21) Appl. No.: 15/638,725

(22) Filed: Jun. 30, 2017

(65) Prior Publication Data
US 2019/0003041 A1    Jan. 3, 2019

(51) Int. Cl.
| | |
|---|---|
| *C23C 16/04* | (2006.01) |
| *C23C 16/455* | (2006.01) |
| *C23C 16/22* | (2006.01) |

(52) U.S. Cl.
CPC ............ *C23C 16/045* (2013.01); *C23C 16/22* (2013.01); *C23C 16/45525* (2013.01)

(58) Field of Classification Search
CPC ............................................... C23C 16/45525
See application file for complete search history.

(56) References Cited

U.S. PATENT DOCUMENTS

| | | | |
|---|---|---|---|
| 2001/0054769 A1* | 12/2001 | Raaijmakers | C23C 16/045 257/758 |
| 2003/0161952 A1* | 8/2003 | Wang | C23C 16/02 427/255.392 |
| 2003/0180445 A1* | 9/2003 | Wang | C23C 4/02 427/58 |
| 2005/0158590 A1* | 7/2005 | Li | C23C 16/403 428/698 |
| 2014/0212534 A1* | 7/2014 | Fletcher | G03F 7/0002 425/385 |
| 2015/0063523 A1 | 3/2015 | Yacout et al. | |
| 2018/0029944 A1* | 2/2018 | Subramanian | F01D 11/08 |

OTHER PUBLICATIONS

"Phase 1A Final Report for the AREVA Team Enhanced Accident Tolerant Fuels Concepts", Contract No. DE-NE-0000567 RPT-3011235-001, prepared by AREVA Federal Services, LLC, Mar. 19, 2015.

* cited by examiner

*Primary Examiner* — Joseph A Miller, Jr.
(74) *Attorney, Agent, or Firm* — Marshall, Gerstein & Borun LLP

(57) ABSTRACT

Provided herein are methods of forming a composite matrix on a porous substrate or a non-porous substrate, the methods including subjecting the substrate to a first deposition method to apply a first coating including first ceramic or metallic particles and form a coated substrate and subjecting the coated substrate to atomic layer deposition to apply a second coating and form the composite matrix, wherein the second coating includes second ceramic or metallic particles.

15 Claims, No Drawings

US 10,392,697 B2

COMPOSITE MATRIX USING A HYBRID DEPOSITION TECHNIQUE

STATEMENT OF GOVERNMENT SUPPORT

This invention was made with government support under contract No. DE-AC02-06CH11357 between the U.S. Department of Energy and UChicago Argonne, LLC, representing Argonne National Laboratory. The government has certain rights in this invention.

FIELD OF THE DISCLOSURE

The disclosure relates generally to a composite matrix made using a hybrid deposition technique. More specifically, the disclosure relates to the formation of a composite matrix using the combination of a deposition method and an atomic layer deposition.

BACKGROUND

Composites such as silicon carbide (SiC)-SiC are typically prepared by infiltration of mesh material/wires with Chemical Vapor Infiltration (CVI) at temperatures above 1000° C. Alternatively, composites may be prepared using high pressure/vacuum infiltration of mesh materials/wires with a slurry followed by annealing at temperatures greater than 1000° C. While such techniques provide high speed deposition at reasonable cost, there are limitations on these methods including, but not limited to, limits on the substrate material in view of the high temperatures required for annealing, large open porosities which are unacceptable in certain applications (e.g., corrosion related), and limitations on the geometry of the substrate that can be infiltrated.

Additionally, currently used deposition methods cannot fill porosities in a substrate distal from the surface of the composite due to uncontrolled deposition rates and line of sight deposition characteristics.

SUMMARY

One aspect of the disclosure provides a method of forming a composite matrix on a porous substrate, the method including (a) subjecting the porous substrate to a first deposition method to apply a first coating including first ceramic or metallic particles and thereby form a coated substrate; and (b) subjecting the coated substrate to a second deposition method to apply a second coating including second ceramic or metallic particles and thereby form the composite matrix, wherein the second deposition method includes atomic layer deposition.

Another aspect of the disclosure provides a method of forming a composite matrix on a non-porous metal or ceramic substrate, the method including (a) subjecting the non-porous metal or ceramic substrate to electrophoretic deposition (ECD) to apply a first coating including first ceramic or metallic particles and thereby form a coated substrate; and (b) subjecting the coated substrate to atomic layer deposition (ALD) to apply a second coating comprising second ceramic or metallic particles and thereby form the composite matrix.

For the methods disclosed herein optional features, including but not limited to components, conditions, and steps are contemplated to be selected from the various aspects, embodiments, and examples provided herein.

Further aspects and advantages will be apparent to those of ordinary skill in the art from a review of the following detailed description. While the methods are susceptible of embodiments in various forms, the description hereafter includes specific embodiments with the understanding that the disclosure is illustrative, and is not intended to limit the invention to the specific embodiments described herein.

DETAILED DESCRIPTION

Provided herein are methods for forming a composite matrix using a hybrid deposition technique. In some aspects, the method includes forming a composite matrix on a porous substrate, the method including subjecting the porous substrate to a first deposition method to apply a first coating comprising first ceramic or metallic particles and thereby form a coated substrate and subjecting the coated substrate to a second deposition method to apply a second coating comprising second ceramic or metallic particles and thereby form the composite matrix, wherein the second deposition method comprises atomic layer deposition (ALD). In embodiments, the first deposition method includes at least one of electrophoretic deposition (EPD), chemical vapor infiltration (CVI), physical vapor deposition (PVD) or any combination thereof. Optionally, the method further comprises depositing a conductive material on the porous substrate prior to subjecting the substrate to the first deposition method. In embodiments, the first coating is not annealed or heat sintered after the first deposition method and the composite matrix is not annealed or heat sintered after atomic layer deposition of the second coating. In embodiments, the method does not comprise any step wherein the temperature exceeds 300° C. or in some cases doesn't exceed 250° C.

In some aspects, the method includes forming a composite matrix on a non-porous metal or ceramic substrate, the method including subjecting the substrate to electrophoretic deposition to apply a first coating comprising first ceramic or metallic particles and form a coated substrate and subjecting the coated substrate to atomic layer deposition to apply a second coating including second ceramic or metallic particles and form the composite matrix. Optionally, the method further comprises depositing a conductive material on the porous substrate prior to subjecting the substrate to the first deposition method. In embodiments, the first coating is not annealed or heat sintered after the first deposition method and the composite matrix is not annealed or heat sintered after atomic layer deposition of the second coating. In embodiments, the method does not comprise any step wherein the temperature exceeds 250° C.

The methods of the disclosure can provide one or more advantages. For example, the first deposition method can be a faster deposition method than ALD, and which can provide a first coating which infiltrates a porous substrate to reduce large open pores in varying sizes (e.g., a few microns to a few millimeters) to sub-micron porosities and/or that can be directly deposited on a non-porous substrate. Further, the second deposition method, which comprises ALD, can provide a coating that infiltrates the sub-micron porosities of the first coating, thereby forming a dense, uniform, composite matrix, which can be nonporous. Additionally, ALD acts to sinter the first ceramic or metallic particles of the first coating, thereby providing a sintered microstructure without exposing the substrate, the first coating, or the composite matrix to extreme conditions.

Substrate

The substrate on which the composite matrix is formed according to the methods of the disclosure is not particularly limited and can be any porous or non-porous substrate. In some cases, the substrate will include materials that are oxidation prone and require a composite coating for protection from low and/or high temperature corrosion. Contemplated substrate materials include, but are not limited to, ceramics, glass ceramics, metals that display metallic conductivity, including but not limited to, zirconium and molybdenum, silicon carbide, and zirconium nitride.

In embodiments, the substrate comprises a porous substrate having a manufactured open porosity architecture. The porous substrate can include, but is not limited to, a weave of wires, a ceramic brick, a metallic foam, a metal or ceramic mesh, a 3D printed open porosity structure, or a combination thereof. The pore size of the porous substrate can be in a range of about 500 nm to about 3 mm, about 1 micron to about 3 mm, about 1 micron to about 2 mm, about 1 micron to about 1 mm, about 1 micron to about 500 microns, about 1 micron to about 250 microns, about 1 micron to about 100 microns, about 1 micron to about 50 microns, about 1 micron to about 25 microns, about 1 micron to about 10 microns, about 1 micron to about 5 microns or about 2 microns to about 5 microns. In embodiments, the substrate comprises a non-porous metal or ceramic substrate.

In some embodiments, the substrate is a conductive substrate. In some embodiments wherein the substrate is not a conductive substrate, the substrate can be coated with a conductive material prior to subjecting the substrate to the first deposition method, to provide the substrate with a conductive surface. Suitable conductive materials for coating a non-conductive substrate surface include nickel, platinum, and silver. The conductive material can be applied to the substrate using any deposition method known in the art. In embodiments, the conductive material is applied to the substrate by subjecting the substrate to ALD.

First Deposition Method

The first deposition method can be any fast deposition method. As used herein, "fast deposition method" is relative to ALD and means a deposition method that can deposit a coating having a thickness of at least one micron in about 24 hours or less, about 12 hours or less, about 6 hours or less, about 3 hours or less, about 1 hour or less, about 30 minutes or less, about 15 minutes or less, about 10 minutes or less, about 5 minutes or less, about 1 minute or less, about 45 seconds or less, or about 30 seconds or less. The first deposition method can include a colloidal solution based method including, but not limited to, electrophoretic deposition. The first deposition method can include at least one of electrophoretic deposition, chemical vapor infiltration, physical vapor deposition or a combination thereof. In embodiments wherein the substrate is a porous substrate and the first deposition method comprises a colloidal solution based method, the first deposition method can further comprise high pressure infiltration, vacuum slurry infiltration, or both.

Electrophoretic deposition (EPD) is obtained by the movement of electrically charged ceramic/metal particles suspended in a fluid under the influence of a relatively high electric field. The charging of the particles takes place by the absorption of ions from the medium or by dissociation of the particle itself. The mobility of the particles in an unbound medium is a function of the field strength, the dielectric constant and viscosity of the fluid and of the zeta potential and radius of the particle. Electrophoresis can be utilized for the induction of ceramic and/or metal particles into the pores of a porous substrate. The particle penetration is facilitated by the electrophoretic force exerted on it and the electroosmotic flow of the fluid into the pores.

The substrate is subjected to the first deposition method to apply a first coating including first ceramic or metallic particles, thereby forming a coated substrate. In embodiments, the first ceramic or metallic particles include particles of an oxide or particles having an oxidized surface. The first ceramic or metallic particles can have a size in a range of about 20 nm to about 75 nm, about 20 nm to about 60 nm, about 40 nm to about 60 nm, about 20 nm to about 50 nm, or about 45 nm to about 75 nm. In general, the smaller the particles the more efficient the deposition when the deposition method comprises a colloidal solution based method. When the first ceramic or metallic particles are submicron in dimension, the further the zeta potential of the particles is from zero (whether positive or negative), the faster the deposition rate using electrophoretic deposition.

The first coating has a thickness of at least about 1 micron, at least about 2 micron, at least about 5 micron, at least about 10 micron, at least about 25 micron, at least about 50 micron and up to about 200 micron, up to about 190 micron, up to about 180 micron, up to about 170 micron, up to about 150 micron, up to about 125 micron, or up to about 100 micron. In general, the thickness of the first coating should be sufficiently thick to prevent oxygen diffusion through the coating. The maximum thickness of the coating can be varied based on practical considerations. For example, if composite matrix on the porous substrate is a rod for use in a nuclear reactor assembly with multiple coated rods, the first coating needs to be sufficiently thin to allow space between the rods for heat transfer purposes and if the thermal neutron capture of the first coating is high then the first coating should be as thin as possible, while still preventing oxygen diffusion through the coating.

The first coating infiltrates the pores of a porous substrate substantially uniformly. As used here, "substantially uniformly" means that the first coating infiltrates at least 90%, or at least 95%, or at least 98% of the pores of the porous substrate and the thickness of the first coating varies by less than 5%, less than 3%, or less than 1% over the surface of the substrate. The uniformity of the coating can be determined from scanning electron microscopy and cross-section studies.

The first coating is generally porous and can include pores having submicron pore diameters. For example, the pores of the first coating can have a size in the range of about 100 nm to about 1 micron. Due to the porous nature of the first coating, the first coating alone provides limited protection against extreme conditions, such as high temperature corrosion.

The particles of the first coating, as deposited, are not well adhered to each other because the first coating is not annealed or heat sintered. Annealing or heat sintering the first layer can create a solid structure and also facilitate the diffusion of the first ceramic or metal particles to provide a non-porous structure. However, the high temperatures required for such annealing or heat sintering detrimentally affect the mechanical properties of the substrate. Accordingly, in embodiments, the first coating is not annealed or heat sintered at temperatures above about 350° C., above about 500° C., above about 750° C., or above about 1000° C.

The first deposition method can deposit the first coating deposit in about 24 hours or less, about 12 hours or less, about 6 hours or less, about 3 hours or less, about 1 hour or less, about 30 minutes or less, about 15 minutes or less, about 10 minutes or less, about 5 minutes or less, about 1 minute or less, about 45 seconds or less, about 30 seconds or less, for example, in about 2 to 12 minutes, about 3 to 10 minutes, about 2 to 5 minutes, or about 8 to 12 minutes. The first deposition method can provide a substantially uniform first coating when the first coating is applied and dried at a temperature in a range of about 100° C. to about 200° C. In embodiments, the temperature does not exceed 300° C. at any point during the deposition of the first coating.

Atomic Layer Deposition

The substrate coated with the first coating can be subjected to atomic layer deposition to apply a second coating and thereby form the composite matrix. The second coating comprises second ceramic or metallic particles. In embodiments, the first coating comprises submicron porosities and the second coating infiltrates the submicron porosities to provide a nonporous matrix. The second ceramic or metallic coating has an amorphous to ultra-nano crystalline grain structure or size. Advantageously, the second coating acts to sinter the first ceramic or metallic particles to provide a dense composite matrix having well adhered particles.

Atomic layer deposition (ALD) is well known in the art. In general, atomic layer deposition is a thin film deposition technique based on gas phase chemical precursors that react with the substrate surface (or coating thereon) one at a time in a sequential, self-limiting, manner, to form the second coating comprising the second ceramic or metallic particles. In ALD, the first precursor molecules can only react with a finite number of reactive sites on the substrate. Once those sites react with the first precursor, the growth stops and the first precursor is flushed from the reactor and the second precursor is introduced. By alternating exposure of the first precursor and the second precursor, a thin film of second ceramic or metallic particles is deposited. The resulting deposit is a conformal coating. The sequence of introducing the first precursor, flushing the first precursor, introducing the second precursor, and flushing the second precursor constitutes an ALD cycle (i.e., for a two precursor system). The growth rate of the ALD coating is defined in terms of growth per ALD cycle. Atomic layer deposition generally has very slow growth rates, making it expensive and difficult to achieve coatings thicker than a few microns.

Typical precursors for ALD include metal-halides, which can be reacted with silicon precursors. However, halide precursors generate acids as byproducts, which can corrode the first coating and/or substrate. In embodiments, the ALD step is performed substantially free of a metal-halide. As used herein, "substantially free of a metal halide" means that metal-halide atomic layer deposition precursors are not purposefully selected, and any incidental metal-halides are present in an amount of less than 5 wt. %, less than 3 wt. %, less than 1 wt. %, or less than 0.5 wt. % based on the total weight of the precursor materials used to prepare the second coating comprising the second ceramic or metallic particles.

Metal organic precursors can also be used in ALD as a precursor for preparing the second coating comprising the second ceramic or metallic particles. Although the growth rate for ALD from metal organic precursors is generally slower than with metal-halide precursors, metal organic precursors can provide an impurity-free coating without generating acids as byproducts. Suitable metal organic precursors for the deposition of second metal particles can include, but are not limited to tetrakis(dimethylamido)zirconium (e.g., for preparation of a second coating of $ZrSiO_4$ (zircon)), molybdenum hexafluoride (e.g., for preparation of a second coating comprising molybdenum), and tungsten hexafluoride (e.g., for preparation of a second coating comprising tungsten).

Other suitable precursors for preparing the second coating comprising second ceramic or metallic particles include, but are not limited to, tris(dimethylamido)silane, hydrogen peroxide, water (e.g., for preparation of a second coating of $ZrSiO_4$ (zircon) when used with a tetrakis(dimethylamido) zirconium organic metal precursor), disilane (e.g., for preparation of a second coating comprising molybdenum when used with molybdenum hexafluoride), and ammonia.

In embodiments, the ALD cycle can include four precursors including tetrakis(dimethylamido)zirconium, tris(dimethylamido)silane, hydrogen peroxide, and water. In embodiments, the ALD cycle can include molybdenum hexafluoride and disilane. In embodiments, the ALD cycle can include tungsten hexafluoride and ammonia.

In general, suitable precursors are able to infiltrate submicron porosities of the first coating and reach the substrate surface, can form stable uniform monolayers that do not self-decompose or react with the surface reaction byproducts, have a high surface reactivity and low surface adsorption property (such that once reacted it can be easily flushed out), provide a relatively high growth rate, and react at relatively low temperatures that have no adverse effect on the substrate. Suitable ALD growth rates can include growth rates in a range of about 1.0 Å per cycle to about 8 Å per cycle, for example, at least about 1.0 Å per cycle, at least about 1.25 Å per cycle, at least about 1.5 Å per cycle, at least about 1.75 Å per cycle, at least about 2.0 Å per cycle, at least about 2.25 Å per cycle, at least about 2.5 Å per cycle, at least about 3.0 Å per cycle, at least about 4.0 Å per cycle, at least about 5 Å per cycle, at least about 6 Å per cycle, at least about 7 Å per cycle, or at least about 8 Å per cycle.

The particles of the second coating infiltrate the pores of the first coating and act as a ceramic adhesive while providing a dense composite. Annealing or heat sintering of the composite matrix is not required. Accordingly, in embodiments, the first coating is not annealed or heat sintered at temperatures above about 350° C., above about 500° C., above about 750° C., or above about 1000° C.

The second deposition method can provide a dense matrix when the second coating is applied at a temperature in a range of about 100° C. to about 300° C., about 125° C. to about 250° C., about 150° C. to about 250° C., about 175° C. to about 250° C., about 200° C. to about 250° C. When the temperature is in a range of about 200° C. to about 250° C., the residual ALD reaction byproducts are easily purged, advantageously increasing the deposition rate by lowering the total time for deposition per cycle. In embodiments, the temperature does not exceed 300° C. at any point during the deposition of the second coating.

Ceramic or Metallic Particles

The first coating and the second coating can independently comprise at least one of SiC (silicon carbide), $ZrSiO_4$ (zircon), tungsten carbide (WC), Kaolinite, aluminum oxide ($Al_2O_3$), lead oxide (PbO), silicon dioxide ($SiO_2$), titanium dioxide ($TiO_2$), silicon nitride ($Si_3N_4$), boron nitride (BN), boron carbide ($B_4C$), calcium hexaboride ($CaB_6$), molybdenum silicide ($MoSi_2$), titanium boride ($TiB_2$), zinc boride ($ZnB_2$), zirconium dioxide ($ZrO_2$), graphite, magnesium dibromide ($MgBr_2$), iron selenice (FeSe), Cu, Ta, Co, Au, Ag, Pt, W, Mb and any combination thereof. In embodiments, each of the first coating and the second coating independently comprise at least one of magnesium dibromide ($MgBr_2$), iron selenide (FeSe), and combinations thereof.

In embodiments, the first coating and the second coating can comprise the same ceramic or metallic particles. A composite matrix formed from a first coating and a second coating including the same ceramic or metallic particles is a homogeneous composite. In embodiments, the first coating and the second coating do not comprise the same ceramic or metallic particles. A composite matrix formed from a first coating and a second coating having different ceramic or metallic particles is a heterogeneous composite.

The selection of the ceramic or metallic particles of the first coating and second coating can be made to provide a composite matrix with desired properties for the product application. For example, for an application wherein the composite matrix will be exposed to high temperatures, a homogenous composite may be selected such that the first ceramic or metallic particles and the second ceramic or metallic particles have compatible thermal expansion properties. As used herein, the first ceramic or metallic particles and the second ceramic or metallic particles have compatible thermal expansion when the variance between the volumetric coefficients of thermal expansion of the two materials is less than about 10%, less than about 5%, or less than about 3%, for a given temperature range. Similarly, for an application wherein the temperature remains fairly constant and the composite is used in a highly corrosive environment, a heterogeneous composite may be selected to provide maximum corrosion prevention.

Composite Matrix

The composite matrix prepared according to the methods disclosed herein comprises a dense, pin-hole free coating. The composite matrix has a thickness of at least about 1 micron, at least about 2 micron, at least about 5 micron, at least about 10 micron, at least about 25 micron, at least about 50 micron and up to about 200 micron, up to about 190 micron, up to about 180 micron, up to about 170 micron, up to about 150 micron, up to about 125 micron, or up to about 100 micron. In general for most embodiments, the thickness of the composite matrix is primarily determined by the thickness of the first coating. The composite matrix includes the first coating and the second coating that has infiltrated submicron porosities in the first coating to provide a non-porous matrix. In embodiments, the second coating does not add substantially to the thickness of the first coating, and thus, the composite matrix. As used herein the second coating does not "add substantially" to the thickness of the first coating and composite matrix when the thickness provided by the application of the second coating is less than about 1 micron, less than about 0.5 micron, less than about 0.25 micron, less than about 0.1 micron, or less than about 0.05 micron. The thickness of the composite matrix should be sufficiently thick to prevent oxygen diffusion through the composite matrix. The maximum thickness of the composite matrix can be varied based on practical considerations. For example, if the substrate is a rod for use in a nuclear reactor assembly with multiple rods, the composite matrix needs to be sufficiently thin to allow space between the rods for heat transfer purposes and if the thermal neutron capture of the first and/or second coating is high then the composite matrix should be as thin as possible, while still preventing oxygen diffusion through the composite matrix.

The second coating substantially infiltrates the pores of the first coating to form a non-porous composite matrix. As used here, "substantially infiltrates" means that the second coating infiltrates and closes at least 90%, or at least 95%, or at least 98% of the pores of the first coating. The uniformity of the coating can be determined from scanning electron microscopy and cross-section studies.

The composite matrix formed by the methods disclosed herein can be a high density composite matrix. As used herein, a high density composite matrix is one that has a bulk density that is at least about 85%, at least 90%, or at least 95% of the theoretical density. The density of the composite matrix can be determined using Archimedes principal. In particular, the density of the composite matrix, $\rho$, equals $(M*\rho_w)/(M-M_w)$, wherein M is the mass of the object when weighed in the air, $\rho_w$ is the density of water, and $M_w$ is the mass of the object when totally submerged in water. For a heterogeneous composite comprising two different ceramic or metallic particles, the mass is measured twice. Once after completion of the first deposition and drying of the ceramic layer, and again after ALD infiltration is complete. Then a theoretical calculation for the density is done for a filled composite matrix made with two different material and compared to that of the developed composite matrix to provide the percent bulk density in terms of the theoretical density. For a homogeneous composite matrix, the mass is measured once, after ALD infiltration. Then a theoretical calculation for density is done for a filled composite matrix made with one material, and compared to that of the of the developed composite matrix to provide the percent bulk density in terms of the theoretical density.

The methods of the disclosure can be better understood in light of the following examples, which are merely intended to illustrate the methods and are not meant to limit the scope thereof in any way.

EXAMPLES

Comparative Example 1

ALD Silicon Carbide Coating of Silicon Carbide Wire Tow

ZIRLO tubes are commonly used in nuclear reactors and must be reinforced to mechanically withstand a loss of coolant (LOCA) nuclear accident and must be protected from high temperature oxidation. The ZIRLO tube is provided with a SiC wire tow weaved over the ZIRLO tube. The SiC tow is prepared from Nicalon wires (80% SiC) that are weaved together to provide an interlocking weave. It was found that the weave by itself was not sufficient to provide high temperature oxidation protection to the ZIRLO tube or hold intact during a LOCA. The SiC wire tow was coated with 300 nm of ALD SiC coating having a growth rate of about 0.1 Angstrom per cycle. The tow was cut by Massachusetts Institute of Technology (MIT). The SiC wires sprung off due to poor strength of the coating.

SEM images of the SiC tow before coating showed the SiC wires packed closely and in a crisscross manner. However, there were gaps in between the SiC wires ranging from about 2 to about 6 microns. Even though the ALD SiC covered all the SiC wires, the 300 nm thickness was not suitable to fill the gap between two wires. The minimum gap between the wires was 2 microns. Accordingly, a coating of at least about 1 micron is required to fill up the porous space of the wire weave and provide the minimum strength to withstand the tow tension due to winding of the SiC wires. In areas where the gaps were about 6 microns, a coating of at least about 3 microns would be required to fill the gaps. The 300 nm coating did not fill all of the gaps of the SiC wire weave and the matrix remained open to outside elements such as moisture and air, and the resulting coating could not provide the substrate with protection from oxidation.

Thus, Comparative Example 1 shows that a 300 nm ALD coating alone does not provide a suitable coating for protecting a substrate in a high temperature oxidation and/or LOCA environment.

Comparative Example 2

ALD Zircon Coating of Silicon Carbide Wire Tow

A ZIRLO tube having a SiC wire tow weaved over the ZIRLO tube was coated with 2 microns of ALD $ZrSiO_4$ (zircon) layer. In particular, tetrakis(dimethylamido)zirconium, tris(dimethylamido)silane, hydrogen peroxide, and water were used to provide an ALD $ZrSiO_4$ coating at a temperature in the range of 200° C. to 250° C. After coating with 2 microns ALD, the strength was enough to hold the wires together even after cutting. However, as areas of the wire tow had gaps larger than 4 microns, the ALD coating was not sufficient for preventing oxidation of the substrate.

Thus, Comparative Example 2 shows that providing a thicker coating on the substrate can provide improved mechanical properties. Comparative Example 2 further shows that providing a thicker coating on a substrate using ALD does not necessarily provide the substrate with protection from oxidation.

Example 3

SiC and Zircon Composite Matrix

A ZIRLO tube having a SiC wire tow weaved over the ZIRLO tube was coated with silicon carbide particles. In particular, an aqueous colloidal solution of sub-micron SiC particles was used to deposit SiC on the wire tow using electrophoretic deposition. After deposition, the composite was dried inside a furnace at a temperature of 150° C. to remove moisture. The resulting SiC coating had submicron pores and was not strongly adhered to the wire tow. The SiC coated tow was subjected to atomic layer deposition to provide a $ZrSiO_4$ (zircon) layer. In particular, tetrakis(dimethylamido)zirconium, tris(dimethylamido)silane, hydrogen peroxide, and water were used to provide an ALD $ZrSiO_4$ coating at a temperature in the range of 200° C. to 250° C. The growth rate for the zircon deposition was around 2.1 Angstrom per cycle. The zircon filled the submicron open porosities of the SiC coating, acting as a ceramic adhesive and providing a dense composite.

Thus Example 3 demonstrate a composite matrix prepared according to the methods of the disclosure having similar or even better than sintering results (i.e., adhesion of ceramic particles and infiltration of pores to provide a dense composite), without exposing the substrate to temperatures greater than 250° C. during formation of the composite matrix.

The foregoing description is given for clearness of understanding only, and no unnecessary limitations should be understood therefrom, as modifications within the scope of the invention may be apparent to those having ordinary skill in the art.

What is claimed:

1. A method of forming a composite matrix on a porous substrate, the method comprising:
   (a) subjecting the porous substrate to a first deposition method comprising electrophoretic deposition (EPD) to apply a first coating comprising first ceramic or metallic particles and thereby form a coated substrate; and
   (b) subjecting the coated substrate to a second deposition method to apply a second coating comprising second ceramic or metallic particles and thereby form the composite matrix, wherein the second deposition method comprises atomic layer deposition (ALD)$_A$,
   wherein step (a) further comprises high pressure infiltration, vacuum slurry infiltration, or both,
   and the second coating infiltrates the first coating.

2. The method of claim 1, wherein the first deposition method further comprises chemical vapor infiltration (CVI), physical vapor deposition (PVD), or any combination thereof.

3. The method of claim 1, wherein the porous substrate is a non-conductive substrate and the method further comprises depositing a conductive material on the porous substrate prior to subjecting the porous substrate to the first deposition method, and the depositing of the conductive material is optionally via ALD.

4. The method of claim 1, wherein the porous substrate comprises a manufactured open porosity architecture.

5. The method of claim 1, wherein the composite matrix comprises a thickness of at least 1 µm and up to 200 µm.

6. The method of claim 1, wherein the first coating infiltrates the pores of the porous substrate substantially uniformly.

7. The method of claim 1, wherein the first coating comprises submicron porosities and the second coating infiltrates the submicron porosities, such that the composite matrix is nonporous.

8. The method of claim 1, wherein the first ceramic or metallic particles and the second ceramic or metallic particles have compatible thermal expansion properties.

9. The method of claim 1, wherein each of the first coating and the second coating independently comprise at least one of SiC (silicon carbide), $ZrSiO_4$ (zircon), tungsten carbide (WC), Kaolinite, aluminum oxide ($Al_2O_3$), lead oxide (PbO), silicon dioxide ($SiO_2$), titanium dioxide ($TiO_2$), silicon nitride ($Si_3N_4$), boron nitride (BN), boron carbide ($B_4C$), calcium hexaboride ($CaB_6$), titanium boride ($TiB_2$), zinc boride ($ZnB_2$), zirconium dioxide ($ZrO_2$), molybdnum silicide ($MoSi_2$), graphite, Cu, Ta, Co, Au, Ag, Pt, W, Mb and any combination thereof.

10. The method of claim 1, wherein the first coating comprises particles of an oxide or particles comprising an oxidized surface.

11. The method of claim 1, wherein the subjecting of step (b) is performed substantially free of a metal-halide.

12. The method of claim 1, wherein the ALD of the second coating has a growth rate of at least 1.5Å per cycle.

13. The method of claim 1, wherein the first coating is not annealed or heat sintered after step (a) and the composite matrix is not annealed or heat sintered after step (b).

14. The method of claim 1, wherein the temperature at which each step is performed is less than or equal to 300° C.

15. The method of claim 1, wherein the first coating is applied and dried at a temperature in a range of about 20° C. to about 200° C.

* * * * *